United States Patent [19]
Schempp et al.

[11] Patent Number: 5,320,549
[45] Date of Patent: Jun. 14, 1994

[54] CONNECTOR WITH PRESS-FIT TERMINAL PINS

[75] Inventors: Otto Schempp, Bad Rappenau; Karl-Heinz Noller, Heilbronn-Biberach; Francesco Carabetta, Hassmersheim, all of Fed. Rep. of Germany

[73] Assignee: Molex Incorporated, Lisle, Ill.

[21] Appl. No.: 17,584

[22] Filed: Feb. 16, 1993

[30] Foreign Application Priority Data

Mar. 6, 1992 [EP] European Pat. Off. ........ 92103800.6

[51] Int. Cl.⁵ .......................................... H01R 23/72
[52] U.S. Cl. ................................................. 439/246
[58] Field of Search .................... 439/78, 83, 246, 252

[56] References Cited
U.S. PATENT DOCUMENTS

| | | | |
|---|---|---|---|
| 4,491,376 | 1/1985 | Gladd et al. | 339/9 |
| 4,753,602 | 6/1988 | Peyrat et al. | 439/246 |
| 5,055,055 | 10/1991 | Bakker | 439/78 |

*Primary Examiner*—Neil Abrams
*Attorney, Agent, or Firm*—A. A. Tirva

[57] ABSTRACT

An electrical connector includes a dielectric housing having a plurality of apertures receiving a plurality of terminals having pin portions projecting from the housing for insertion into complementary holes in a printed circuit board. At least some of the terminals are mounted in the housing for movement between first and second positions in response to mounting the connector to the printed circuit board. In the first position, the terminals are fixed relative to the housing to facilitate alignment and insertion of the pin portions into the holes in the printed circuit board. In the second positions, the terminals can float relative to the housing to accommodate a differential in thermal expansion between the housing and the printed circuit board. Other terminals are mounted in the apertures and maintained in a fixed position relative to the housing when some of the terminals are in floating positions. An insertion tool having a flat bottom surface applies an insertion force to the top of the housing and also defines an upper limit for movement of the terminals within the housing.

5 Claims, 2 Drawing Sheets

CONNECTOR WITH PRESS-FIT TERMINAL PINS

FIELD OF THE INVENTION

This invention generally relates to the art of electrical connectors and, particularly, to a header connector having terminals with pin portions insertable into holes in a printed circuit board.

BACKGROUND OF THE INVENTION

A well known type of electrical connector commonly is called a header connector and includes an elongated housing of dielectric material mounting a plurality of terminals having pin portions projecting from the underside of the housing for insertion into holes in a printed circuit board. The pin portions are inserted into the holes in the printed circuit board with an interference fit. The terminals usually are mounted in rows lengthwise of the elongated housing for engaging complementary terminals of a mating electrical connector which can be interconnected with the header connector to electrically couple the mating connector with circuit traces on the printed circuit board. The pin portions of the terminals often provide solder tails for soldering to the circuit traces either in plated-through holes in the board or to solder pads surrounding the holes.

Various problems are encountered in both the manufacture and use of such electrical connectors. In particular, during manufacture it is desirable to fix the terminals in the dielectric housing, within aperture means corresponding to the holes in the printed circuit board, so that the pin portions are properly aligned for easy insertion into the board holes. If the terminals are not fixed to align the pin portions, a misaligned pin can be damaged during assembly, or the pin may interfere with proper assembly of the connector onto the board.

On the other hand, when the terminals are fixed within the connector housing, and with an interference fit between the pin portions of the terminals and the holes in the printed circuit board, problems arise in use because of different thermal expansion coefficients between the di-electric material of the connector housing and the substrate of the printed circuit board. Sometimes, the terminals are allowed to float (or relatively move) within the connector housing to compensate for the differential in thermal expansion. However, floating pins can cause manufacture/assembly problems, as described above.

This invention is directed to a unique mounting of the terminals within the connector housing to fix the terminals for easy manufacture and assembly of the electrical connector to the printed circuit board and subsequently to allow the terminals to float relative to the connector housing.

SUMMARY OF THE INVENTION

An object, therefore, of the invention is to provide a new and improved mounting system for terminals in connector housings of the type wherein the terminals have pin portions for insertion into holes in a printed circuit board.

Generally, the invention is disclosed in an electrical connector which includes a dielectric housing having a plurality of apertures receiving a plurality of terminals having pin portions projecting from the housing for insertion into the holes in the printed circuit board. The invention contemplates means for mounting at least some of the terminals in the housing apertures for movement between first positions, wherein the terminals are fixed relative to the housing to facilitate alignment and insertion of the pin portions into the holes in the printed circuit board, and second positions, wherein the terminals can float relative to the housing to accommodate a differential in thermal expansion between the housing and the printed circuit board.

In the exemplary embodiment of the invention, the apertures in the connector housing have first and second sections for receiving mounting portions of the terminals when the terminals are in their first and second positions, respectively. The first sections of the apertures provide a press fit with the mounting portions of the terminals, and the second sections of the apertures provide a loose fit with the mounting portions of the terminals. Preferably, the first sections of the apertures are sized and configured relative to the mounting portions of the terminals and relative to an appropriate interference fit between the pin portions and the holes in the printed circuit board, whereby the terminals are moved from their first positions to their second positions automatically in response to insertion of the pin portions into the holes in the printed circuit board. Stop means, in the form of an insertion tool or complementary abutment surfaces between the housing and the mounting portions of the terminals, define the second positions of the terminals.

The invention also contemplates that other ones of the terminals be mounted in the housing apertures for maintaining the other terminals fixed relative to the housing when in their second positions. These other terminals thereby maintain location of the connector on the printed circuit board.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
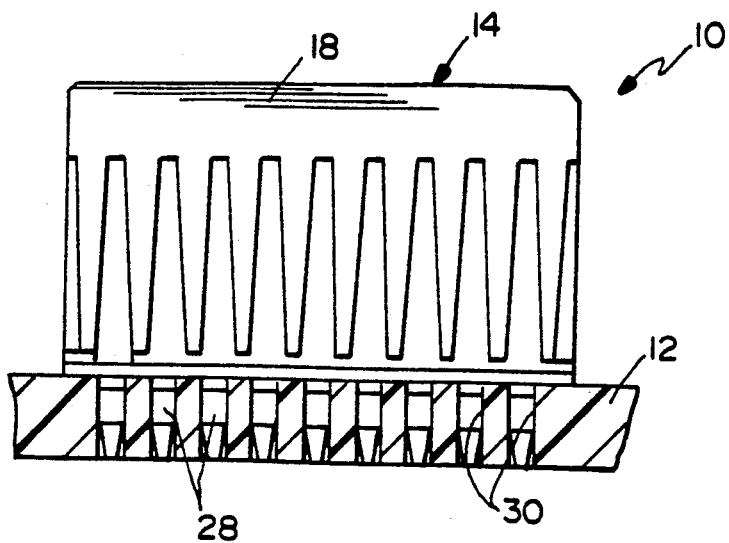
FIG. 1 is a side elevational view of a header-type electrical connector embodying the concepts of the invention.
Figure 2:
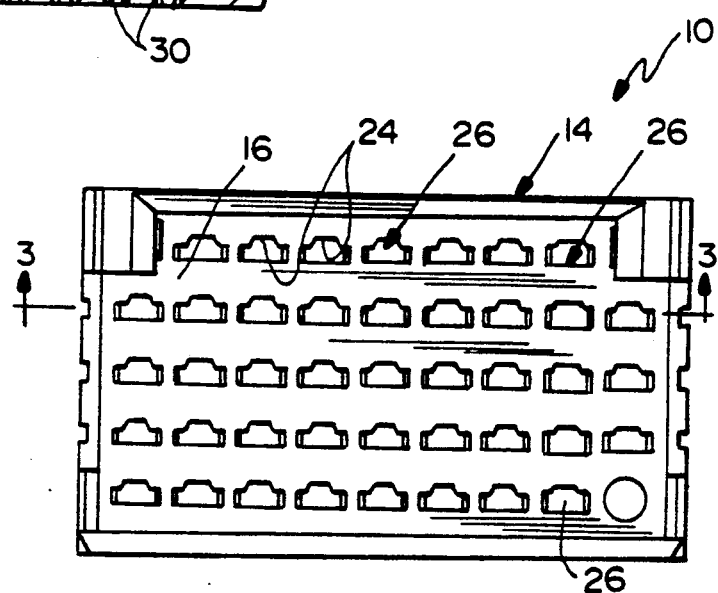
FIG. 2 is a bottom plan view of the electrical connector.
Figure 3:
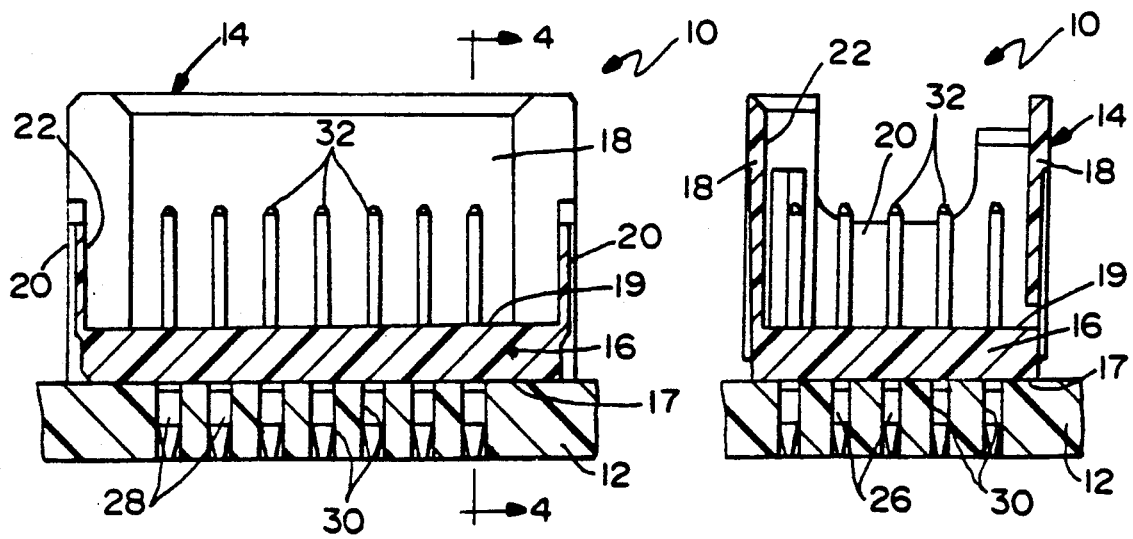
FIG. 3 is a vertical section taken generally along line 3—3 of FIG. 2.
Figure 4:
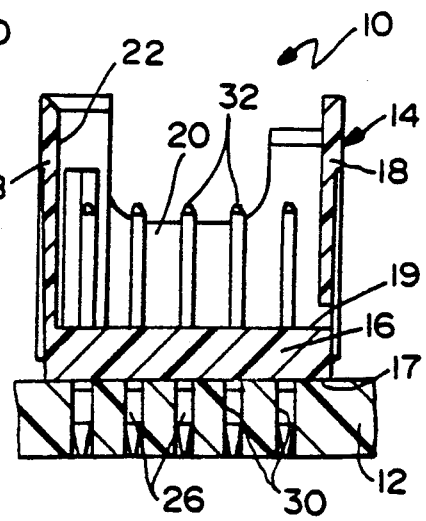
FIG. 4 is a vertical section taken generally along line 4—4 of FIG. 3.

Referring to the drawings in greater detail, and first to FIGS. 1-4, the invention is disclosed in a header-type electrical connector, generally designated 10, for mounting to a printed circuit board 12. The connector includes a dielectric housing, generally designated 14, unitarily molded of plastic material, or the like. The housing has a bottom wall 16 and upstanding side walls 18 and end walls 20 defining a cavity 22 for receiving a complementary mating electrical plug connector (not shown). A plurality of through apertures 24 (FIG. 2) are provided in bottom wall 16 of housing 14 receiving and mounting a plurality of terminals, generally designated 26 (FIG. 2). As shown, the apertures and respective terminals are disposed in an array of a plurality of rows.

Terminals 26 have pin portions 28 projecting from the lower surface 17 of the bottom wall 16 of housing 14 for insertion into complementary holes 30 in printed circuit board 12. Pin portions 28 normally provide press-fit tails to contact plated-through holes (30) in the board. The pin portions (28) are inserted into the holes in the printed circuit board by an interference fit. As best in FIGS. 3 and 4, terminals 26 also have terminal pins 32 projecting upwardly from the top surface 19 of wall 16 within cavity 22 of housing 14. The terminal pins electrically interconnect with mating female terminals of the complementary plug connector which is inserted into cavity 22.

Generally, the invention contemplates that at least some terminals 26 be mounted in housing apertures 24 for movement between first positions, wherein the terminals are fixed relative to the housing to facilitate alignment and insertion of pin portions 28 into holes 30 in printed circuit board 12, and second positions, wherein terminals 26 can float relative to housing 14 to accommodate a differential in thermal expansion between the housing and the printed circuit board.

Figure 5:
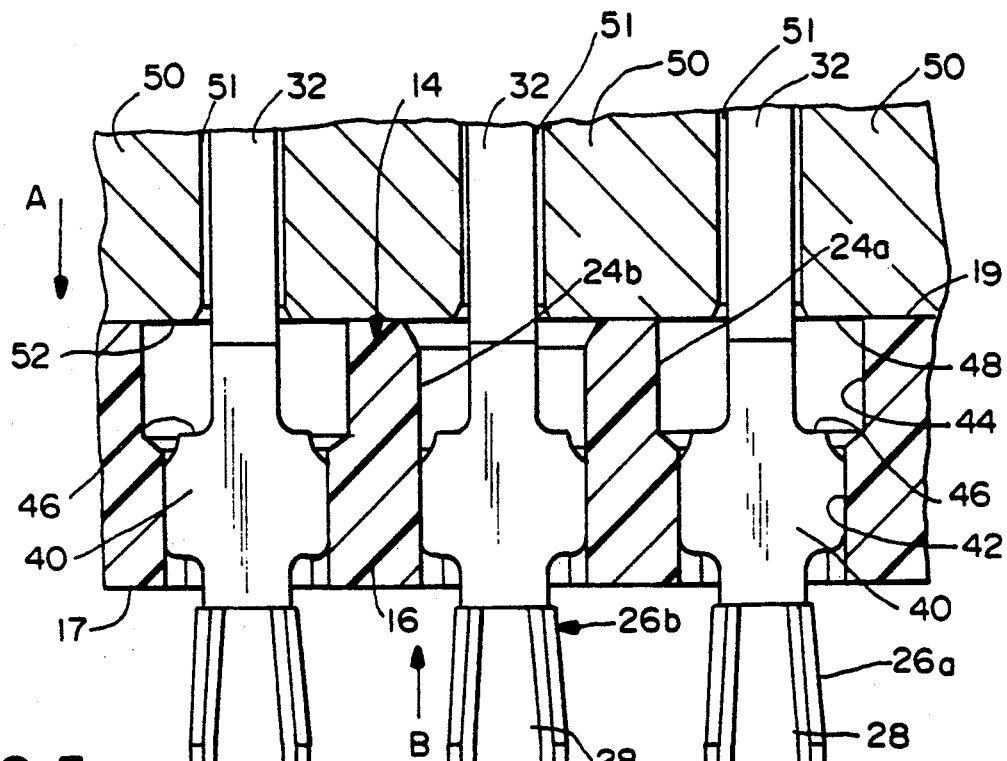
FIG. 5 is a fragmented section through a pair of apertures in the connector housing, showing a respective pair of terminals in their first position fixed relative to the housing.
Figure 6:
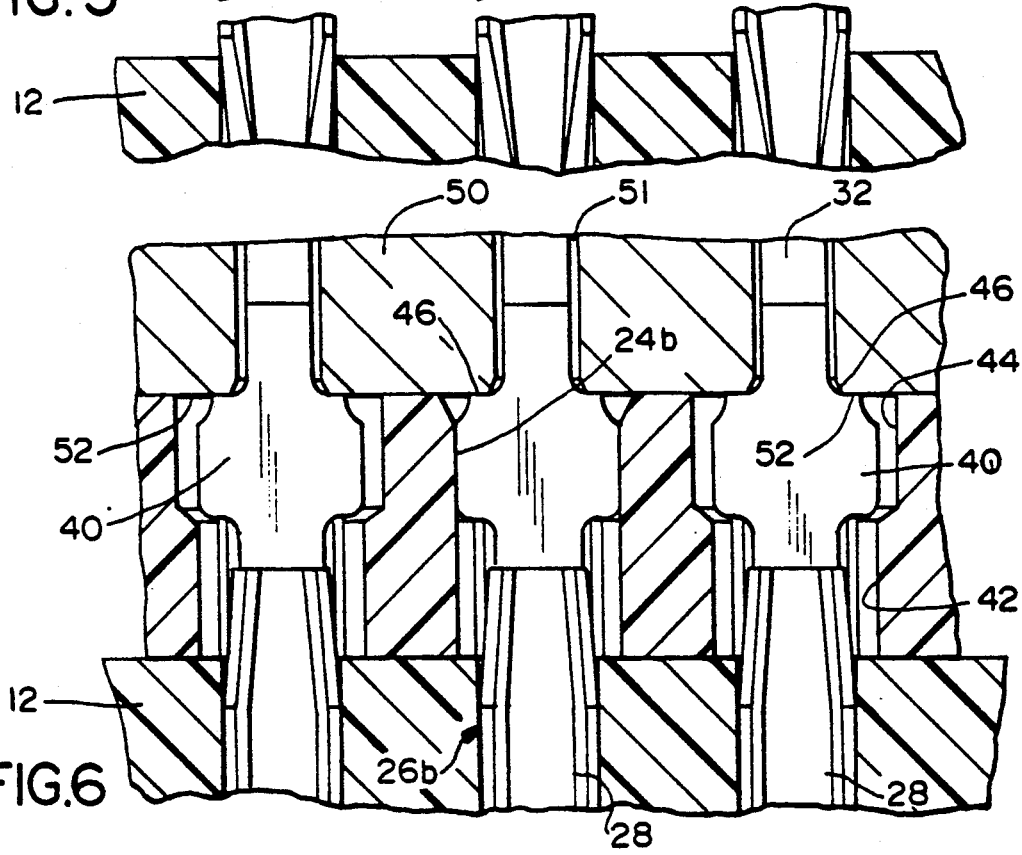
FIG. 6 is a view similar to that of FIG. 5, with the terminals moved to their second positions, with one of the terminals fixed relative to the housing and the other terminal floating relative to the housing.

More particularly, referring to FIGS. 5 and 6, two identical terminals are shown, but the right-hand terminal in each figure is generally designated 26a and the left-hand terminal is generally designated 26b. Likewise, the through apertures in housing bottom wall 16 have been designated such that the right-hand aperture for terminal 26a is generally designated 24a, and the left-hand aperture for terminal 26b is generally designated 24b. Both identical terminals 26a, 26b have press-fit pin portions 28 which are inserted into the holes in the printed circuit board by an interference fit. FIGS. 5 and 6 show that the identical terminals have widened mounting portions 40 which are located within apertures 24a, 24b regardless of the positions of the terminals generally described above.

Referring first to the right-hand aperture 24a in FIGS. 5 and 6, it can be seen that the aperture has a first, lower section 42 and a second, upper section 44. Mounting portion 40 of terminal 26a is shown in FIG. 5 located in lower section 42 of aperture. Terminal 26a is assembled within the connector housing with mounting portion 40 press fit into aperture section 42. This fixes terminal 26a to the connector housing to facilitate alignment and insertion of the pin portion into its respective hole 30 in printed circuit board 12.

To mount the electrical connector 10 onto printed circuit board 12, each pin portion 28 is inserted into its respective hole 30 in the printed circuit board wherein it encounters interference fit forces with the bounds of its respective hole. An insertion tool 50 having apertures 51 to accommodate pins 32 and a substantially flat bottom surface 52 for engaging top surface 19 of wall 16 is applied to the connector housing 14 to move it downwardly in the direction of arrow "A" (FIG. 5). The forces of the interference fit between each pin portion 28 and its respective hole in the printed circuit board, causes the pin to move upwardly relative to housing 14, in the direction of arrow "B" (FIG. 5).

When housing 14 of electrical connector 10 is moved completely against the top surface of printed circuit board 12, terminal 26a is moved upwardly relative to the housing whereby mounting portion 40 of the terminal is located in upper section 44 of aperture 24a. This position is shown in FIG. 6, and it can be seen that aperture section 44 is larger than mounting portion 40. Therefore, terminal 26a is allowed to float relative to housing 14 to accommodate a differential in thermal expansion between the housing and the printed circuit board. Stop means in the form of an abutment shoulder 46 on the top of terminal mounting portion 40, along with the bottom surface 52 of the insertion tool 50, define the upper limit position of terminal 26a.

Within the concepts of the invention, it, of course, is contemplated that the forces of the press fit of mounting portion 40 within lower aperture section 42 be less than the forces of the interference fit between pin portion 28 of terminal 26a in its respective hole in the printed circuit board, so that the terminal is moved from its fixed position to its floating position automatically in response to mounting electrical connector 10 onto printed circuit board 12. The interference fit forces are easily calculated, and the size and configuration of aperture 42 relative to mounting portion 40 can be designed accordingly.

The invention contemplates that a majority of terminals 26 (FIGS. 1-4) mounted within housing 14 of connector 10 be mounted within apertures in the housing as described above in relation to right-hand terminal 26a and aperture 24a in FIGS. 5 and 6. However, other of the terminals, such as the left-hand terminals 26b in FIGS. 5 and 6, desirably may be fixed relative to housing 14 when terminals 26a are in their second or floating positions.

More particularly, it can be seen that the left-hand aperture 24b in FIGS. 5 and 6 is uniformly dimensioned and is not provided with two different sections, as aperture 24a is provided with lower and upper sections 42 and 44, respectively. Therefore, when connector 10 is mounted onto printed circuit board 12 by moving housing 14 downwardly onto the board in the direction of arrow "A" (FIG. 5), terminal 26b will move upwardly relative to the housing in the direction of arrow "B", from the position shown in FIG. 5 to the position shown in FIG. 6. Contrary to floating terminal 26a, it can be seen in FIG. 6 that terminal 26b remains fixed within the uniformly dimensioned aperture 24b. These "fixed" terminals facilitate maintaining proper position of electrical connector 10 on printed circuit board 12 while still allowing a degree of differential thermal expansion between the connector housing and the printed circuit board. For instance, a center row of terminals 26 (FIG. 2) may be mounted in apertures such as aperture 24b in FIGS. 5 and 6. The resistance of the single row of fixed terminals is not sufficient to create problems due to the differential in thermal expansion. The terminals, fabricated of metal material, are sufficiently resilient to obviate any damage thereto.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. In an electrical connector which includes a dielectric housing having a plurality of apertures receiving a plurality of terminals terminating in pin portions projecting from the housing for press-fit insertion into complementary holes in a printed circuit board, wherein the improvement comprises means for mounting at least some of the terminals in the housing apertures for movement between first positions wherein the terminals are fixed relative to the housing to facilitate alignment and insertion of the projecting pin portions into the holes in the printed circuit board in an interference fit and second positions wherein the terminals can float relative to the housing to accommodate a differential in thermal expansion between the housing and the printed circuit board and, wherein other ones of the terminals are mounted in the apertures by means for maintaining said other terminals fixed relative to the housing when said at least some terminals are in said second, floating positions.

2. In an electrical connector as set forth in claim 1, wherein said apertures have first and second sections for receiving mounting portions of said at least some terminals when the terminals are in said first and second positions, respectively, the first sections of the apertures providing a press fit with the mounting portions of the terminals and the second sections of the apertures providing a loose fit with the mounting portions of the terminals and, wherein said first sections of the apertures are sized and configured relative to the mounting portions of said at least some terminals and relative to an appropriate interference fit between the pin portions and the holes in the printed circuit board whereby the terminals are moved from said first positions to said second positions in response to insertion of the pin portions into the holes in the printed circuit board.

3. In an electrical connector as set forth in claim 2, wherein said first sections of the apertures are sized and configured relative to the mounting portions of said at lest some terminals and relative to an appropriate interference fit between the pin portions and the holes in the printed circuit board whereby the terminals are moved from said first positions to said second positions in response to insertion of the pin portions into the holes in the printed circuit board.

4. In an electrical connector as set forth in claim 2, including stop means between the housing and the terminals defining said second positions.

5. In an electrical connector as set forth in claim 4, wherein said housing is elongated and said other terminals are located generally centrally of the housing.

* * * * *